PIEZO-ELECTRIC OSCILLATOR WITH CROSSED WIRES FOR FILTER

Filed Oct. 27, 1964

3 Sheets-Sheet 1

PIEZO-ELECTRIC OSCILLATOR WITH CROSSED WIRES FOR FILTER

Filed Oct. 27, 1964

3 Sheets-Sheet 2

3,336,541

PIEZO-ELECTRIC OSCILLATOR WITH CROSSED WIRES FOR FILTER

Yoshihiro Ura, Machida-shi, Japan, assignor to Kokusai Denki Kabushiki Kaisha (known as Kokusai Electric Co., Ltd.), Tokyo-to, Japan, a joint-stock company of Japan Filed Oct. 27, 1964, Ser. No. 406,773
Claims priority, application Japan, Nov. 2, 1963, 38/58,588, 38/58,589; Dec. 28, 1963, 38/70,531
10 Claims. (Cl. 333—72)

ABSTRACT OF THE DISCLOSURE

A highly stable piezo-electric oscillator made of a disk-shaped piezo-electric body having electrodes on the major side surfaces. A conductor is disposed on each of the major surfaces of the electrodes. The wires cross at right angles. Leads are provided for applying signals to the oscillator.

Filter arrangements are made by using a plurality of oscillators made as above described and coupled by a coupling wire acting as one of the crossed wires on the electrode major surfaces. Either or both disk-shaped and bar-shaped resonators are coupled serially on the coupling wire for carrying out the desired filtering.

The present invention relates to improvements of a piezo-electric oscillator and more particularly to miniature type piezo-electric oscillators in which asymmetrical oscillations which are near the desired oscillating mode are effectively eliminated.

In case the piezo-electric oscillator as described above is utilized as an electromechanical transducer of an electromechanical filter or a resonator of a ceramic filter, nonuniformities of construction and material distribution of the oscillator cannot be completely avoided, so that suppression of the undesired oscillations caused by asymmetrical oscillations becomes very important in practice.

A general object of the present invention is to effectively suppress the above mentioned asymmetrical oscillations in an easily embodiable means.

Another object of the present invention is to provide an electromechanical filter in which the length thereof is very short, and wide freedom of designing the band width is obtained.

A further object of the present invention is to provide an electromechanical filter which is very stable in its operation, very low in its equivalent impedance, and uniform in its functional character.

The above objects and other objects and advantages of the present invention have been attained by utilizing a piezo-electric oscillator which is constructed by attaching a metal wire on each of the upper and lower electrodes of a disk-shaped piezo-electric-material along a diametrical position thereof. The upper and lower metal wires are perpendicular to each other. In the present invention, an electrostriction material may be used in place of the piezo-electric-material.

The nature, principle, and details of the invention will be more clearly apparent from the following description with respect to preferred embodiments of the invention, when taken in connection with the accompanying drawings, in which like parts are designated by like reference characters, and in which:

FIG. 1 diagrammatically illustrates a piezo-electric oscillator according to the present invention and FIGS. 1(A), 1(B) and 1(C) are, respectively, plan, side and rear views;

FIG. 2 is a graph illustrating characteristic curves illustrating a frequency character of a two terminal impedances of the element shown in FIG. 1;

FIG. 3 diagrammatically illustrates an electromechanical filter according to the present invention, in which FIGS. 3(A), 3(B) and 3(C) are, respectively, plan, side and rear views;

FIG. 4 is a graph of an oscillating characteristic curve of a disk-shaped resonator to be used for the electromechanical filter;

FIG. 5(A) and FIG. 6(A) are plan views of actual embodiments of the electromechanical filters according to the present invention;

FIG. 5(B) and FIG. 6(B) are side views of the embodiments of FIGS. 5(A) and 6(A);

Figure 10A:
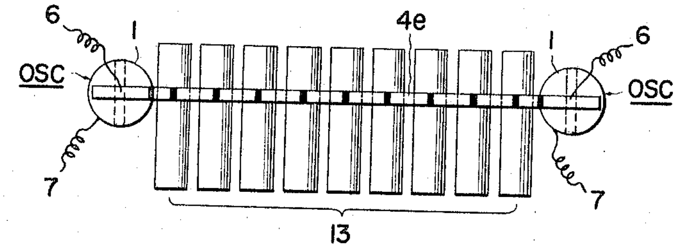
Figure 10B:
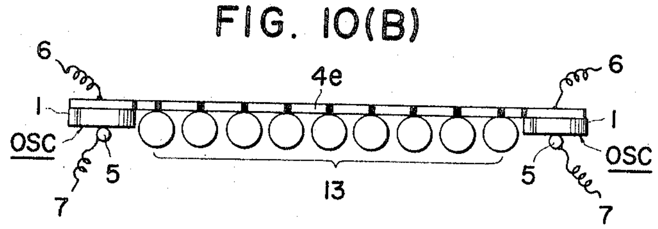
Figure 11A:
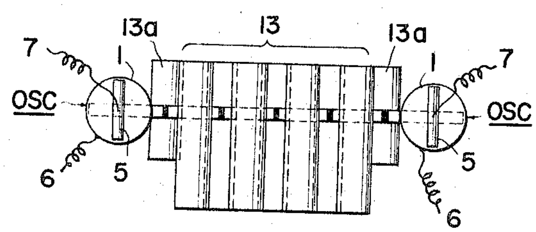
Figure 11B:
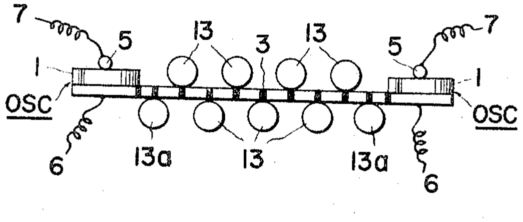

FIG. 10(A) and FIG. 10(B) are respectively plan and side views of a further embodiment of the electromechanical filter according to the present invention; and FIG. 11(A) and 11(B) are respectively plan and side views of a still another embodiment of the eletromechanical filter according to the present invention.

Figure 1A:
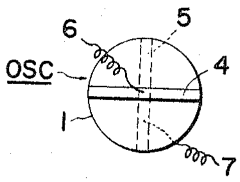
Figure 1B:
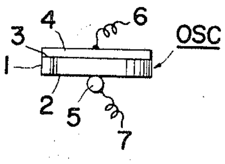
Figure 1C:
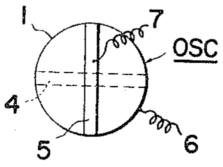

Referring to FIGS. 1(A), 1(B) and 1(C), a piezo-electric oscillator OSC consists of a disk 1 made of a piezo-electric material. Silver electrodes 2 and 3 are attached onto the major side surfaces which constitute the upper and lower surfaces of the disk 1 by means such as silver brazing, and thin wires 4 and 5 made of an alloy having a constant elasticity and adhered respectively onto the upper and lower surfaces of the electrodes 3 and 2 by a method such as soldering. Prior to adhering of the wires 4 and 5, the piezo-electric disk 1, provided with the electrodes 2 and 3, is generally subjected to polarization by a high voltage. In this case, the wires 4 and 5 are adhered onto the respective electrodes along their diametric direction so that the wires 4 and 5 cross perpendicularly to each other.

Figure 2:
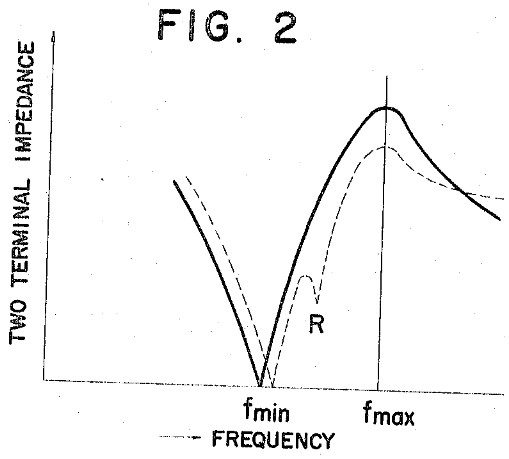

In the disk-shaped piezo-electric oscillator, two terminal impedance viewed from a constant current power source causes occasionally undesired oscillation such as shown by R in FIG. 2 due to asymmetrical oscillation produced between the frequency $f_{min}$ corresponding to a minimum impedance and the frequency $f_{max}$ corresponding to a maximum impedance. The impedances are caused by longitudinal oscillation in the diametric direction as shown by a dotted line in FIG. 2. However, according to the construction as shown in FIGS. 1(A), 1(B) and 1(C), since the upper and lower wires 4 and 5 are perpendicular to each other, the characteristic curve representing the relation between the two terminal impedance and frequency becomes as shown by the solid line in FIG. 2, whereby undesired vibration can be completely eliminated. This elimination is due to the fact that asymmetricity of the piezo-electric disk 1 itself is eliminated by the point symmetricity of the cross wires 4 and 5.

Furthermore, in the embodiment of FIG. 1, influences exerted by additional mass of the lead wires 6 and 7 can be easily avoided by connecting the wires 6 and 7 onto the central points of the upper and lower wires 4 and 5, respectively.

The above-mentioned embodiment relates to the case of diametrically directioned oscillation of a disk-shaped piezo-electric oscillator, but this invention can be similarly applied to other oscillation modes having point symmetricity, for example bending oscillation of a disk-shaped body.

As the electromechanical transducers of the conventional electromechanical filters have been utilized so-called combined transducers each of which consists of a piezo-electric body, metal electrodes attached onto both surfaces of said body, and coupling wires connected to the electrodes by a connecting method such as soldering, screwing, or welding. In these combined transducers, the piezo-electric body and metal electrodes are adhered by means of epoxy-resin, so that it becomes difficult to completely remove unstabilities of the joint portions due to temperature variations. However, according to the present invention, an electromechanical filter having an excellent filtering character and having no abovementioned disadvantages of the conventional filters can be obtained by utilizing the piezo-electric oscillator as illustrated in FIG. 1. This fact will be described in detail in connection with the examples shown in FIGS. 3, 5, 6, 8 and 9.

Figure 3A:
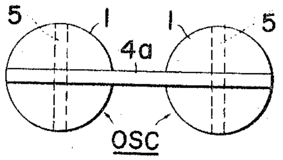
Figure 3B:
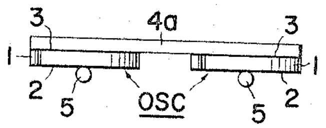
Figure 3C:
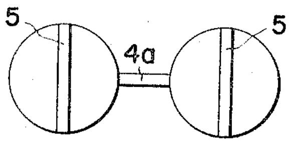
Figure 4:
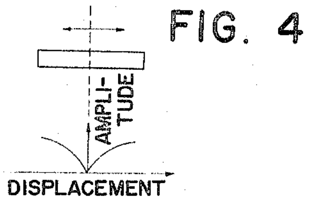

Referring to FIGS. 3(A), 3(B), and 3(C), the disk-shaped piezo-electric oscillators OSC, each consisting of a disk 1 made of a piezo-electric material and silver electrodes 2 and 3 attached onto upper and lower surfaces of said disk by means such as silver brazing, are coupled by a coupling wire 4*a* attached onto the upper surfaces of the electrodes 3 along diameters thereof by a method such as soldering. Metal wires 5 are adhered on the lower surfaces of the electrodes 2 in such a manner that the wires 5 cross perpendicularly the coupling wire 4*a*, whereby asymmetric oscillation of each piezo-electric oscillator is suppressed as described in connection with FIGS. 1 and 2. Furthermore, since each of the piezo-electric oscillators exhibits diametrical oscillation having an amplitude displaced radially from the center, the ampitude-displacement character becomes as shown in FIG. 4, so that the periphery of the oscillator corresponds to the loop and amplitude inclination becomes minimum. In this case, since the radial oscillation frequency of each oscillator is scarcely affected by the thickness thereof, variation of the oscillation frequency caused by the coupling wire 4*a* and the metal wires 5 is very small and this fact is entirely the same in connection with higher order oscillations.

Accordingly, when two alike disk-shaped piezo-electric oscillators OSC are coupled by a coupling wire 4*a* at an appropriate distance, except the distance corresponding to half wave length as shown in FIG. 3, an electromechanical filter of two elements type can be obtained. According to such a construction of the electromechanical filter, the following advantages can be obtained.

(a) Operation becomes very stable because of no existence of resinous adhesive agent at each coupling point.

(b) Since amplitude at each coupling point is maximum and amplitude inclination is minimum at said point, the equivalent impedance of the oscillator becomes low, thus enabling wide band transmission.

(c) Since undesired oscillations are suppressed by the thin wires 5, an electromechanical filter having uniform and excellent character can be easily manufactured.

Figure 5A:
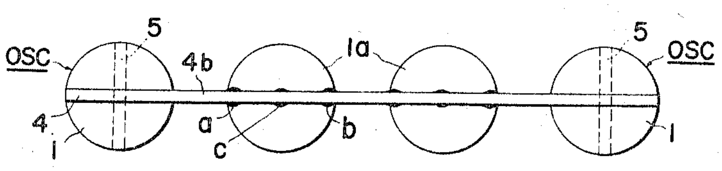
Figure 5B:
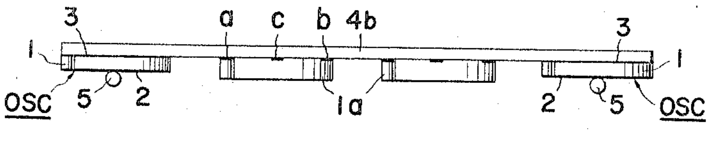

The embodiment of FIG. 5 relates to a multistage filter constructed by connecting two disk-shaped resonators 1*a* between two disk-shaped piezo-electric oscillators OSC such as illustrated in FIG. 3. Each of the resonators 1*a* is made of a metal resonator and is coupled at its peripheral points *a*, *b* and a central point *c* with a coupling wire 4*b*. It has been determined, according to experiments, that coupling at the central point participates in effective removing of the undesired oscillation of the resonators 1*a*.

Figure 6A:
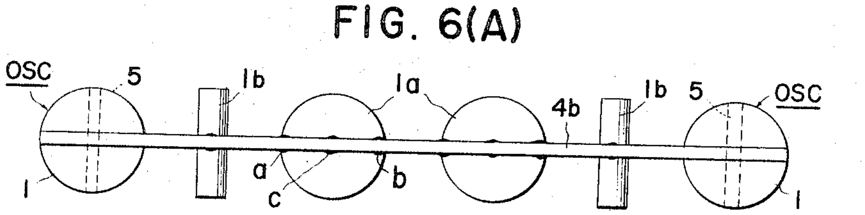
Figure 6B:
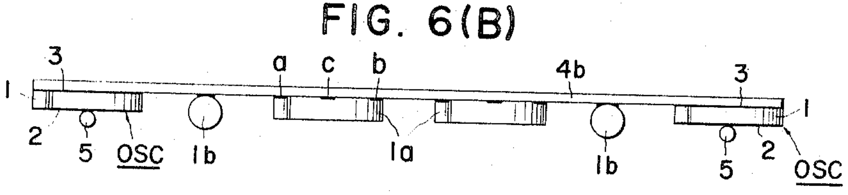

The embodiment of FIG. 6 is almost equal to that of FIG. 5 except that rod-shaped torsional resonators 1*b* are coupled in series, respectively, between the piezo-electric oscillators OSC and their adjacent resonators 1*a*. According to the embodiment of FIG. 6, although the frequency of the desired torsional mode of the resonators 1*b* coincides with the frequency of the desired radial mode of the disk-shaped resonator 1*a*, since the frequency distribution of the undesired oscillations except the desired torsional mode frequency, is entirely different from that of the disk-shaped resonators 1*a*, undesired oscillations can be sufficiently suppressed. Furthermore, the mechanical impedance at the coupling point of each rod-shaped torsional resonator 1*b* is designed so that it is equal to or lower than that of a disk-shaped resonator 1*a*, but higher than that of the piezo-electric oscillator OSC.

Figure 7:
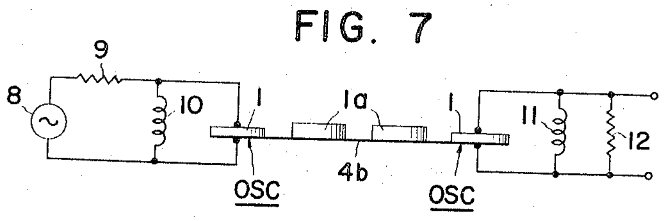
FIG. 7 is a circuit diagram of an electromechanical filter according to the present invention.

In FIG. 7 are shown input and output circuits of the electro-mechanical filter of the embodiment of FIG. 5. In the circuits of FIG. 7, input power is supplied from a signal source 8 to a left side piezo-electric oscillator OSC through a terminal resistance 9 and a tuning inductance 10, said resistance 9 and inductance 10 being designed so as to be resonated with the internal capacity of said oscillator OSC, and output power is transmitted from the other piezo-electric oscillator OSC through a tuning inductance 11 and a terminal resistance 12 which are designed so as to be resonated with the capacity of the output circuit.

Figure 8:
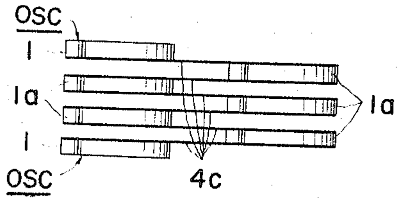
FIG. 8 and FIG. 9 are side views of other embodiments of the electromechanical filter according to the present invention.
Figure 9:
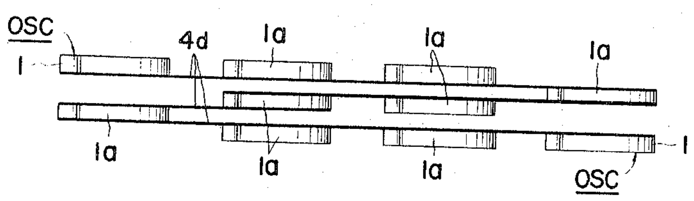

FIGS. 8 and 9 relate to other embodiments of the filter according to the present invention. FIG. 8 relates to a case in which the filter consists of two disk-shaped terminal oscillators OSC and a plurality of intermediate resonators 1*a* which are successfully coupled by coupling wires 4*c* in superimposed states, and FIG. 9 relates to a case in which two disk-shaped terminal oscillators OSC and a plurality of intermediate resonators 1*a* are successively coupled by coupling wires 4*d* in regularly superimposed states.

According to the embodiments of FIGS. 8 and 9, arrangement of the filter in a small space can be made possible.

According to the embodiments of FIGS. 3, 5, 6, 7, 8 and 9, disk-shaped piezo-electric oscillators which oscillate radially are utilized as the transducers and coupled at the points on their peripheries by means of coupling wire, so that their operational character becomes very stable, and furthermore, since a metal wire is provided on the transducer in the direction perpendicular to the coupling wire, undesired oscillation is effectively suppressed, whereby an electromechanical filter having a uniform and excellent character can be easily manufactured.

The piezo-electric oscillator shown in FIG. 1 can be used as the electromechanical transducers of an electromechanical filter such as shown in FIGS. 10(A) and 10(B), in which the disk-shaped oscillators OSC such as shown in FIG. 3 are used as both the terminal transducers and a plurality of rod-shaped resonators 13 are arranged between the transducers and coupled by a coupling wire 4*e* at their coupling points. The coupling wire is attached to the transducers along diametrical positions.

In the filter of FIG. 10, when the transducer OSC on the input side is subjected to excitation by supplying an A-C voltage on the input terminals 6 and 7, the transducer OSC is excited in a radial direction so as to excite the coupling wire 4*e* in its longitudinal direction, whereby the resonators 13 attached to the coupling wire 4*e* are excited by the longitudinal stress of the coupling wire 4*e* so as to carry out torsional oscillation. Accordingly, an oscillation having a defined frequency band width is transmitted toward the output side through the coupling wire 4*e*, whereby the transducer OSC at the output side is mechanically excited, thus producing an output of electric energy at the output terminals 6 and 7. The transducers OSC are provided at their rear surfaces with respective thin wires 5 having constant elasticity in order to eliminate asymmetrical oscillations. The thin wires are perpendicular to the coupling wire 4*e*.

In the filter illustrated in FIG. 10, it is impossible to make the distance between the adjacent coupling points of the resonators 13 smaller than the diameter of the resonator 13 from the construction point of view, whereby freedom of designing the band width is restricted and furthermore it is impossible to shorten the total length.

According to the present invention, disadvantages of the filter of FIG. 10 can be eliminated by a filter illustrated in FIGS. 11(A) and 11(B). The construction of the filter of FIG. 11 is almost equal to that of the filter illustrated in FIG. 10 except the resonators 13 and 13*a* are arranged in two rows on opposite surfaces of the coupling wire 4*e* in which the intermediate resonators 13 are designed so as to carry out torsional vibration of third order at the rated frequency of the filter and the terminal resonators 13*a* are designed so as to carry out torsional oscillation of a second order at the rated frequency. Since the oscillation mode orders of the terminal resonators and intermediate resonators are different, subsidiary indesired resonating frequencies of two kinds of the resonators are different, whereby response produced from the intermediate resonators 13 is suppressed. In the electromechanical filter in which rod-shaped resonators of a torsional oscillation type are used and these resonators are coupled at their peripheries, the following conditions are necessary in order to enlarge the tolerance error in the production thereof.

(a) Each resonator is driven at its loop point.
(b) The coupling distance between the adjacent resonators is selected to be ¼ of the wave length.
(c) The coupling wire is as thin as possible within an allowable range from the mechanical point of view.

These conditions have been determined from theoretical and experimental results.

According to the filter illustrated in FIG. 11, although the distance between the adjacent resonators is larger than the diameter of the resonator on one side surface of the coupling wire, it is possible to reduce the distance to less than the diameter of a resonator when the resonators are viewed from opposite surfaces of the coupling wire, whereby a miniaturized construction can be realized and, the distance between the adjacent transducer and resonator can be made to be ¼ of the wave length. The resonators can be driven at their loop points, thus enabling uniform construction of an electromechanical filter of a narrow band type and decreasing the allowable production error.

It should be understood of course, that the foregoing disclosure relates only to particular examples of the present invention and that it is intended to cover all changes and modifications of the examples of the invention herein chosen for the purposes of the disclosure, which do not constitute departures from the spirit and scope of the invention as set forth in the appended claims.

What I claim is:

1. A piezo-electric oscillator consisting of a disk-shaped piezo-electric body and electrodes attached thereto on opposite major side surfaces, metal wires adhered onto the surfaces of said electrodes along diameters of said electrodes such that said wires are perpendicular to each other, and lead wires connected to said wires.

2. An electromechanical filter, comprising two disk-shaped piezo-electric oscillators each provided on opposite major side surfaces thereof with respective electrodes attached thereto and utilized as transducers in operation, a coupling wire attached onto a same one of the major side surfaces of the electrodes and extending along diameters thereof, and each oscillator having metal wires adhered on the other major side surfaces of said electrodes in positions such that said metal wires are perpendicular to said coupling wire.

3. An electromechanical filter according to claim 2, including a disk-shaped metal resonator coupled in series between both disk-shaped piezo-electric oscillators, means coupling said resonator to said oscillators comprising said coupling wire coupled to said resonator along a diametrical position thereof.

4. An electromechanical filter according to claim 2, in which at least one disk-shaped metal resonator and at least one rod-shaped metal resonator are coupled in series between both said disk-shaped piezo-electric oscillators and said coupling wire being attached to said resonators along points of symmetry thereof.

5. An electromechanical filter according to claim 2, including a plurality of bar-shaped resonators coupled to said coupling wire between said oscillators for a serial mode of operation, said resonators each coupled to said coupling along points of axial symmetry, and said resonators being disposed spaced axially on said wire.

6. An electromechanical filter according to claim 5, in which said resonators are arranged on a common side of said coupling wire.

7. An electromechanical filter according to claim 5, in which said resonators are arranged on opposite sides of said coupling wire.

8. An electromechanical filter according to claim 5, in which said resonators comprise electrostrictive resonators.

9. An electromechanical filter according to claim 2, including a plurality of disk-shaped resonators coupled serially on said coupling wire between said oscillators, said coupling wire being coupled to a major side surface of each of said resonators and extending along a diameter thereof.

10. An electromechanical filter according to claim 9, in which said resonators are disposed in superposed positions.

No references cited.

ROY LAKE, *Primary Examiner.*

DARWIN R. HOSTETTER, *Examiner.*